United States Patent
Hong

(10) Patent No.: US 9,640,246 B2
(45) Date of Patent: May 2, 2017

(54) MEMORY TRACKING SCHEME

(71) Applicant: Taiwan Semiconductor Manufacturing Company, Ltd., Hsin-Chu (TW)

(72) Inventor: Hyun-Sung Hong, Kanata, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/493,064

(22) Filed: Sep. 22, 2014

(65) Prior Publication Data

US 2016/0086657 A1    Mar. 24, 2016

(51) Int. Cl.
*G11C 11/417* (2006.01)
*G11C 7/22* (2006.01)
*G11C 11/419* (2006.01)

(52) U.S. Cl.
CPC ............ *G11C 11/417* (2013.01); *G11C 7/227* (2013.01); *G11C 11/419* (2013.01)

(58) Field of Classification Search
None
See application file for complete search history.

(56) References Cited

U.S. PATENT DOCUMENTS

| | | | |
|---|---|---|---|
| 8,467,257 B1 * | 6/2013 | Liu ................... | G11C 7/065 365/154 |
| 2008/0144419 A1 * | 6/2008 | Wu .................... | G11C 11/413 365/226 |
| 2009/0231934 A1 * | 9/2009 | Jung .................. | G11C 7/08 365/189.15 |
| 2012/0327727 A1 * | 12/2012 | Wang ................. | G11C 11/417 365/189.16 |

* cited by examiner

*Primary Examiner* — James G Norman
(74) *Attorney, Agent, or Firm* — Slater Matsil, LLP

(57) ABSTRACT

A tracking circuit for a memory includes a tracking cell. A tracking word line is connected to the tracking cell. A tracking bit line is connected to the tracking cell. A voltage generator is configured to provide a variable tracking cell power supply voltage to the tracking cell based on a control signal.

20 Claims, 8 Drawing Sheets

MEMORY TRACKING SCHEME

BACKGROUND

Semiconductor memory devices are continually shrinking in size while at the same time increasing in density or volume and operating at a lower power. The operations of memory devices are synchronized based on clock signals, which may reach different parts of a memory device at different times. A difference in signal paths results in various problems including a reduced read time margin, which may lead to data being improperly read from the memory.

Tracking circuits for memory cells provide signals based on which memory access signals such as read signals for memory cells having data written therein are generated. In some applications, the read tracking circuits are designed such that a worst case condition for reading memory cells is covered. For advanced semiconductor memory devices, designing proper tracking circuits is a challenge.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
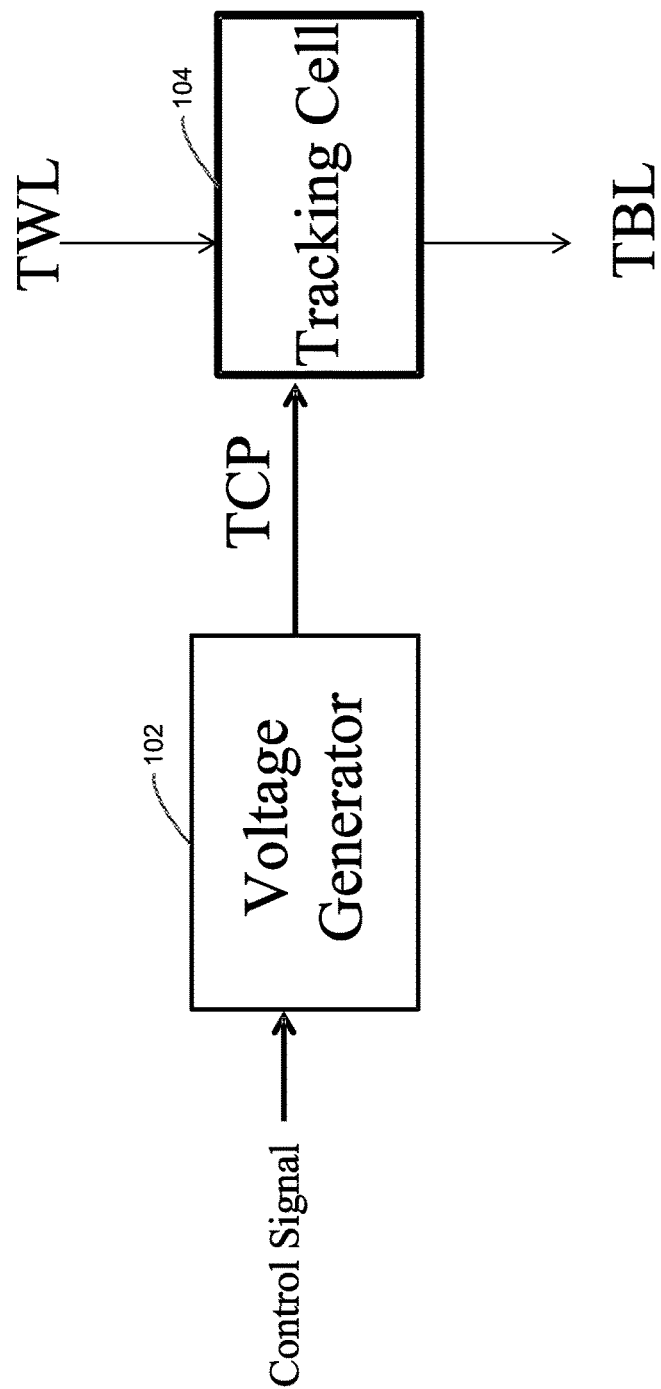
FIG. 1 is a block diagram of an exemplary tracking circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

One example of a semiconductor memory device, a static random access memory (SRAM), includes multiple memory cells arranged in an array having rows and columns. Different memory systems would have different sizes with different numbers of rows and/or columns. Different types of memory cells in a memory system and different sizes of the memory system can affect the duration of a sufficient read time. A tracking circuit with a timing tracking mechanism accommodates timing tracking of different configurations of memory systems to be used along with different size memory in some embodiments. In some embodiments, a read time tracking mechanism works with memory arrays with different configurations, which have different widths and lengths.

Each memory cell includes four, six, or more transistors that form a latch for storing a bit of information in some embodiments. Additionally, each memory cell is connected to one of word lines (WL), such as write word lines (WWL) or read word lines (RWL), which extend horizontally across an SRAM array forming rows of the SRAM array. The memory cells are also coupled to bit lines (BL) and complementary bit lines referred to as bit line bar (BLB), such as write bit lines (WBL), write bit line bars (WBLB), read bit lines (RBL), and read bit line bars (RBLB). The bit lines extend across the SRAM array to form columns of the SRAM array.

Data is written to the memory cells by controlling the voltages on the WWL and providing the data on bit lines WBL and WBLB to be transferred to a storage node of the memory cell. Data is read from the memory cells by controlling a voltage of the RWL and sensing a resultant voltage after the stored data in the storage node of the memory cell is transferred to the RBL and RBLB. The process of writing data to and reading data from the memory cells takes a certain amount of time, which varies based on a distance between the memory cell and a memory controller as well as on variances across the SRAM array due to process, voltage, and temperature (PVT).

Because of PVT variations, access timing of a memory can be also affected accordingly. In a memory design, the timing control, e.g., access timing, of the memory is one of many important issues. Memory operation timing and power consumption can be impacted with an inappropriate design. For example, if the access timing of the memory is too early before a stored data is fully transferred to the bit line connected to the memory cell, an error may occur in the read operation of the memory cell.

Consequently, SRAM arrays, and other semiconductor memories such as dynamic random access memories (DRAMs), also include tracking circuits to detect delays in signals transmitted through the memory array. The delays detected through the use of tracking signals are used to adjust the timing of the memory control signals to ensure that the read time margin of the memory cell is sufficient such that data can be properly read from the memory in some embodiments.

For example, a read tracking circuit includes one or more tracking cells and a number of loading memory cells in some embodiments. Each tracking cell is connected to a tracking word line (TWL) and a tracking bit line (TBL). The tracking circuit can be connected to a sense amplifier enable (SAE) signal generator, which sends timing signal to a sense amplifier (SA), which senses the logic levels from the bit line, and amplifies the small voltage swing to recognizable logic levels to be interpreted properly at the output terminal. If SAE signal is sent too early, a read failure may occur at the SA output. Conversely, if the SAE signal is sent too late, the read access time increases unnecessarily.

In some tracking schemes, the timing of the tracking cell has a fixed performance and it may be difficult to change this tracking cell performance based on the PVT variation. For example, based on the timing of the tracking cell, a tracking bit line delay signal TBL_D can be generated, which becomes a reference of sensing enable or cycle time. The delay of the TBL_D is controlled by a control signal, sometimes referred to as a trimming signal. A user can control TBL_D timing by the trimming signal. In such tracking cells, the tuning option is generally made with a logic cell that selects delays. The logic cell is a part of logic cells, not part of the actual memory cells.

However, the PVT variations of the logic cell and the SRAM cell are not the same. If the memory cell and the logic cell have different performances, the delay TBL_D from the logic cell may not correctly emulate (or simulate) memory cell performance. Thus, even if there are tuning options with the logic cell for the delay, the tuned delay using the logic cell may not properly address the PVT variation of the SRAM cell. Since the performance of SRAM cell is depend on PVT variations, a user cannot change the SRAM cell performance correctly based on such a tracking circuit. Therefore, an adjustable tracking scheme providing a flexible solution that could correctly reflect the PVT variations of the memory cell may be beneficial.

FIG. 1 is a block diagram of an exemplary tracking circuit in accordance with some embodiments. In FIG. 1, a voltage generator 102 is coupled to a tracking cell 104. The tracking cell 104 is coupled to a tracking word line TWL and a tracking bit line TBL. The voltage generator 102 provides a tracking cell power voltage TCP to the tracking cell 104. The tracking cell power voltage TCP is generated by the voltage generator 102 based on a control signal. By changing the tracking cell power voltage TCP provided to the tracking cell 104, the effective delay of the tracking cell 104 can be controlled. For example, as the tracking cell power voltage TCP is increased, the tracking bit line TBL response time becomes faster in some embodiments. The control signal can be adjusted for a desired delay to reflect the variable PVT conditions of a memory. Thus, more accurate memory access timing can be generated that matches the PVT variation of the memory.

Figure 2:
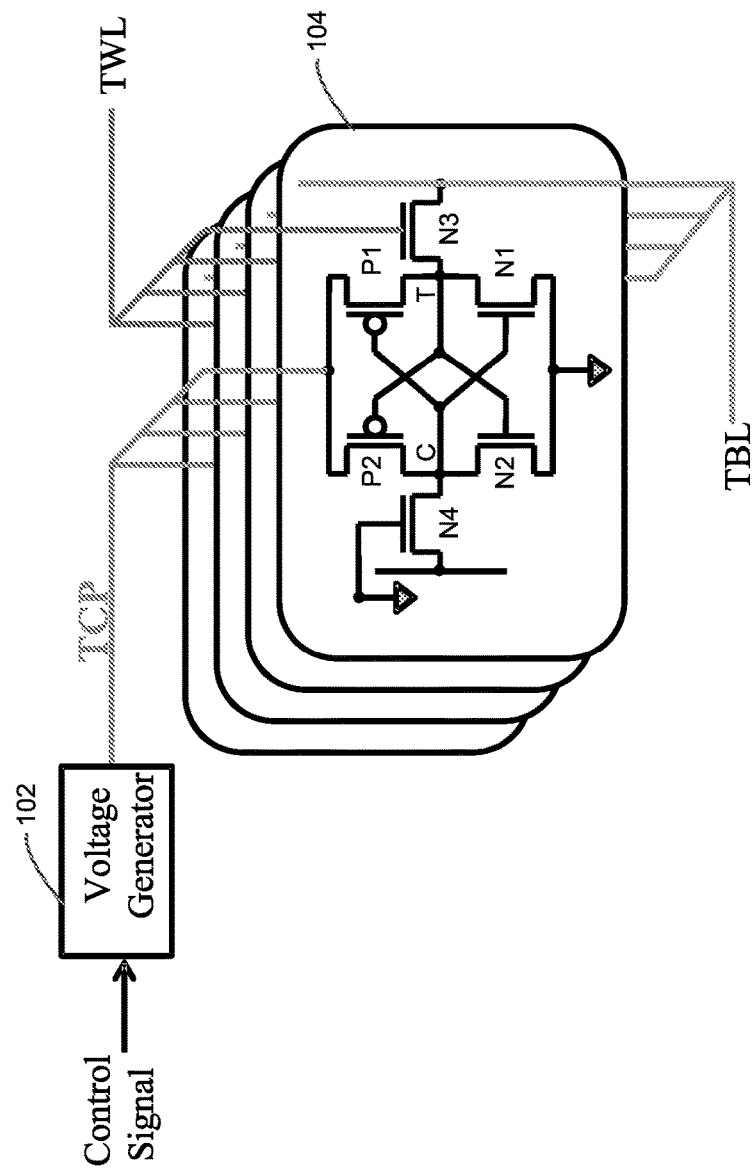
FIG. 2 is a schematic diagram of the exemplary tracking circuit in FIG. 1 in accordance with some embodiments.

FIG. 2 is a schematic diagram of the exemplary tracking circuit in FIG. 1 in accordance with some embodiments. There are four tracking cells 104 shown in FIG. 2. The number of tracking cells 104 depends on the application, process, and design purpose of the memory. The voltage generator 102 is coupled to the four tracking cells 104. The tracking word line TWL and the tracking bit line TBL are also coupled to the four tracking cells 104. The voltage generator 102 provides the tracking cell power voltage TCP to the four tracking cells 104. The tracking cell power voltage TCP is generated by the voltage generator 102 based on the control signal received by the voltage generator 102.

Initially, the tracking cell power voltage TCP can be determined based on a simulation, data from a similar memory, measurement on a similar memory, estimation from a previous design, or any other suitable method in some embodiments. A corresponding control signal is generated to provide the tracking cell power voltage TCP. The value of the tracking cell power voltage TCP can be changed and updated during testing and/or operation of the memory that includes the tracking cell 104 in some embodiments.

The tracking cell 104 in FIG. 2 shows an exemplary tracking cell structure using six transistors. In other embodiments, a different number of transistors, such as eight, ten, or other number of transistors can be used. In FIG. 2, the tracking cell 104 includes two PMOS transistors P1 and P2, and four NMOS transistors N1, N2, N3, and N4. The PMOS transistor P1 and the NMOS transistor N1, the PMOS transistor P2 and the NMOS transistor N2 form cross-coupled inverters coupled to the tracking bit line TBL through a pass gate NMOS transistor N3. The gate of the NMOS transistor N3 is coupled to the tracking word line TWL. There is another pass gate NMOS transistor N4, which is turned off by connecting its gate to the ground for the tracking operation that does not need to turn on the NMOS transistor N4.

A data node T of the tracking cell 104 stores a low logic value (logic 0), and a complementary data node C stores a complementary logic value (logic 1/logic high) in some embodiments. The data node T is coupled to the tracking bit line TBL through the pass gate N3, and the complementary data node C is coupled to the pass gate NMOS transistor N4. When the pass gates N3 is in a non-conductive state (i.e., the tracking word line TWL is not asserted), the tracking cell 104 floats with the data stored on data nodes T and C retaining its values. (The NMOS transistor N4 is turned off for the tracking operation.)

Access to the tracking cell 104 is enabled by asserting the tracking word line TWL. For example, as the tracking word line TWL is enabled (logic 1/logic high), the pass gate NMOS transistor N3 is turned on. The tracking bit line TBL is pre-charged to a logic 1/logic high before the tracking word line TWL is enabled. Since the data node T stores logic 0/logic low, the pre-charged tracking bit line TBL is pulled down from logic 1/logic high to logic 0/logic low for the tracking operation. The response time of the tracking bit line TBL can be used to control access timing of the memory as described below. The TWL and TBL waveforms for the tracking operation are described below with respect to FIG. 7.

Figure 3B:
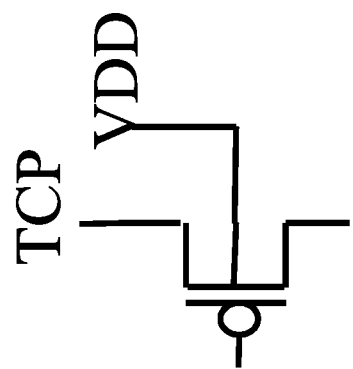
FIGS. 3A and 3B show bulk (substrate) biasing of PMOS transistors in the tracking cell of FIG. 2 in accordance with some embodiments.
Figure 3A:
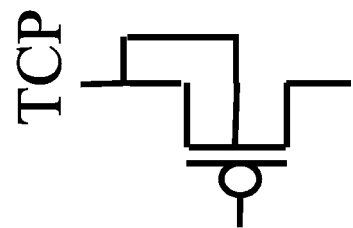

FIGS. 3A and 3B show bulk (substrate) biasing of PMOS transistors P1 and/or P2 in the tracking cell 104 of FIG. 2 in accordance with some embodiments. To prevent change in the threshold voltage of the PMOS Transistor (P1 and/or P2), the bulk (substrate) of the PMOS transistor is biased according to FIG. 3A or FIG. 3B in some embodiments.

In FIG. 3A, a source of the PMOS transistor (P1 and/or P2) is coupled to the tracking cell power voltage TCP. Also, the bulk (substrate) of the PMOS transistor (P1 and/or P2) is coupled to the tracking cell power voltage TCP in some embodiments.

In FIG. 3B, a source of the PMOS transistor (P1 and/or P2) is coupled to the tracking cell power voltage TCP. On the other hand, the bulk (substrate) of the PMOS transistor (P1 and/or P2) is coupled to the high power supply voltage VDD of the memory in some embodiments.

Figure 4:
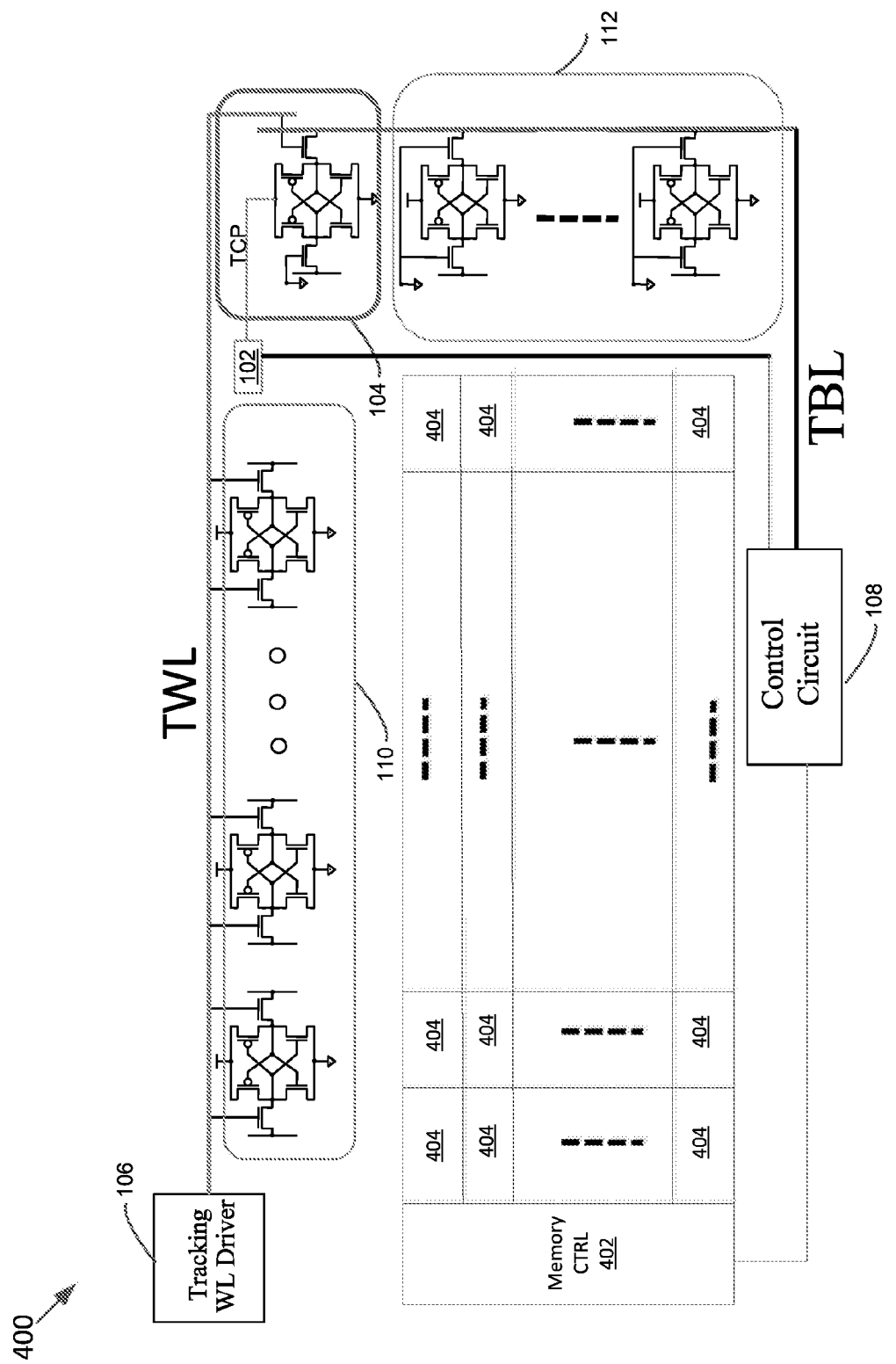
FIG. 4 is a schematic diagram of the exemplary tracking circuit in FIG. 1 in a memory in accordance with some embodiments.

FIG. 4 is a schematic diagram of the exemplary tracking circuit in FIG. 1 in a memory 400 in accordance with some embodiments. The memory 400 includes memory control circuit 402 and memory cells 404. The memory control circuit 402 controls the operation of the memory 400. For example, the memory control circuit 402 controls timing for enabling/disabling the word line to access the memory cells 404, pre-charging bit lines, enabling sense amplifier, etc. The memory 400 includes the voltage generator 102 coupled to the tracking cell 104. The memory 400 also includes first load memory cells 110 for the tracking word line TWL and second load memory cells 112 for the tracking bit line TBL.

The load memory cells 110 and 112 are coupled to the tracking word line TWL and the tracking bit line TBL respectively to emulate the loading effects (e.g., capacitance) of memory cells in the memory 400 that are coupled to each word line and bit line of the memory.

A tracking word line driver 106 is coupled to the tracking word line TWL to enable/disable the tracking word line TWL for accessing the tracking cell 102. A control circuit 108 is coupled to the tracking bit line TBL. The control circuit 108 detects the response time of the tracking bit line TBL. The control circuit 108 can provide the tracking bit line TBL response time to the memory control circuit 402 in some embodiments. The control circuit 108 generates the control signal sent to the voltage generator 102 based on the response time. The control signal sent from the control circuit 108 is received by the voltage generator 102. The voltage generator 102 generates the tracking cell power voltage TCP based on the control signal. The control scheme is described below in more detail.

Figure 5:
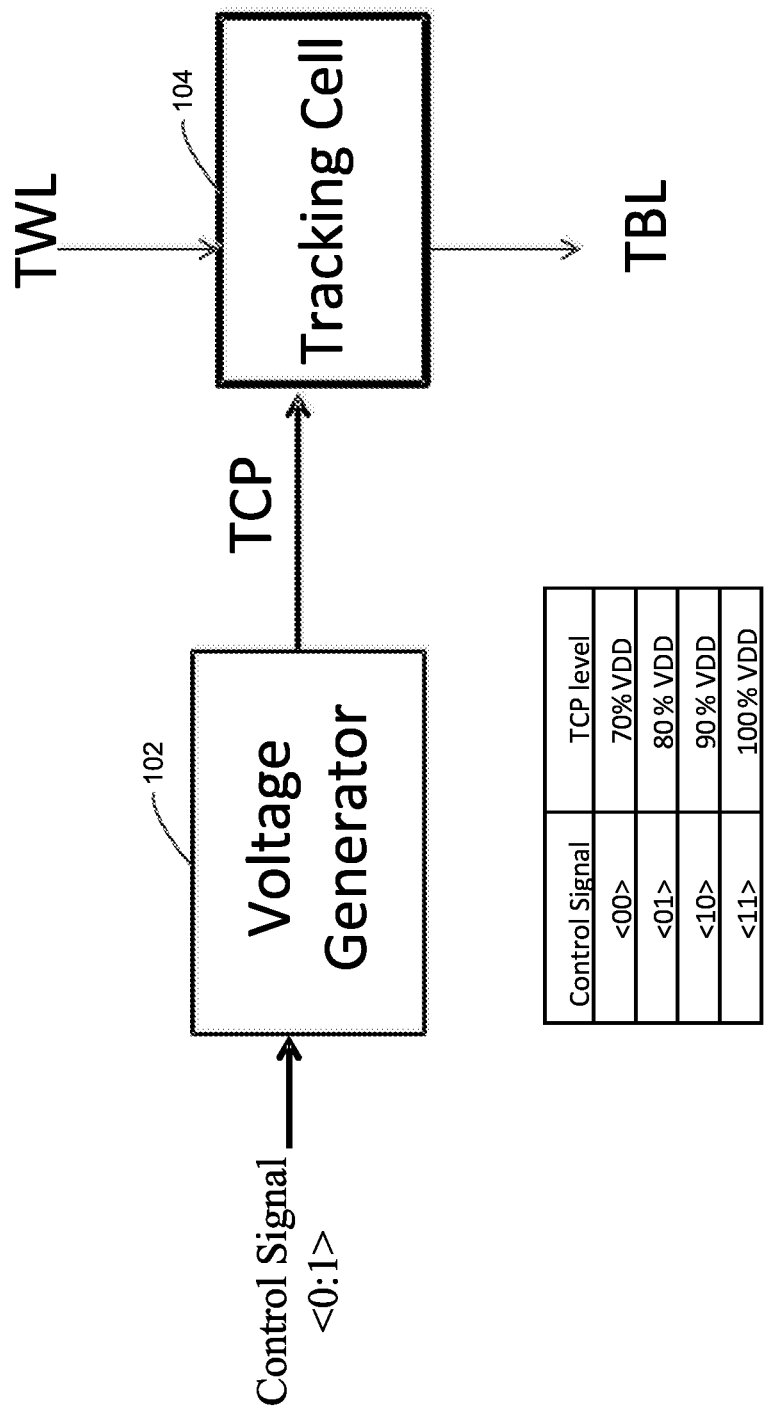
FIG. 5 is a block diagram of the tracking circuit in FIG. 1 with an exemplary control scheme in accordance with some embodiments.

FIG. 5 is a block diagram of the tracking circuit in FIG. 1 with an exemplary control scheme in accordance with some embodiments. In FIG. 5, the control signal is shown with 2 bits <0:1> as an example. In other embodiments, any number of bits can be used for the control signal. As the control signal is received, a corresponding tracking cell power voltage TCP is generated by the voltage generator 102.

In some embodiments, the initial tracking cell power voltage TCP can be determined based on a simulation, data from a similar memory, measurement on a similar memory, estimation from previous design, or any other suitable method. A corresponding control signal is generated to provide the tracking cell power voltage TCP. The value of the tracking cell power voltage TCP can be changed and updated during testing and/or operation of the memory that includes the tracking cell 104 in some embodiments.

In this example, if the control signal <00> is received, the voltage generator 102 provides 70% of the high power supply voltage VDD to the tracking cell 104 as the tracking cell power voltage TCP. If the control signal <01> is received, the voltage generator 102 provides 80% of the high power supply voltage VDD to the tracking cell 104 as the tracking cell power voltage TCP. If the control signal <10> is received, the voltage generator 102 provides 90% of the high power supply voltage VDD to the tracking cell 104 as the tracking cell power voltage TCP. If the control signal <11> is received, the voltage generator 102 provides 100% of the high power supply voltage VDD to the tracking cell 104 as the tracking cell power voltage TCP.

In some embodiments, the tracking cell power voltage TCP range controlled by the control signal can be adjusted corresponding to the desired tracking cell speed (delay) range from estimated or measured PVT variations of memory cells. For example, from estimated or measured PVT variations of memory cells, the control signal range can be determined to change the tracking cell power voltage TCP to cover a 3-sigma or 6-sigma variation range of corresponding tracking cell speed (delay). In some embodiments, a 6-sigma range is used to cover a relatively slow speed memory device, and a 3-sigma range is used to cover a relatively fast speed memory device. The effect of different tracking cell power voltage TCP is described below with respect to FIG. 6.

Figure 6:
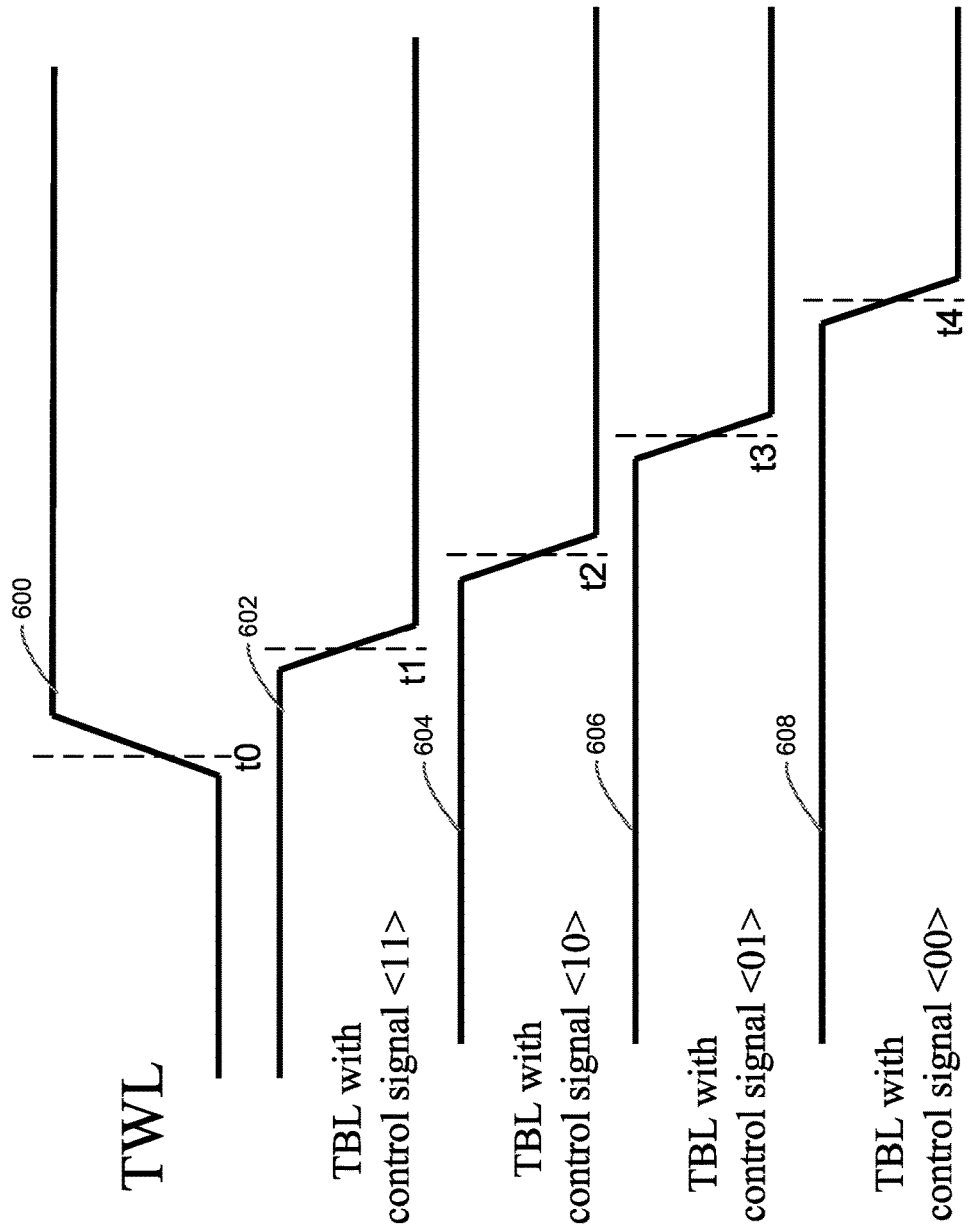
FIG. 6 is a plot showing waveforms of TWL and TBL with different control signals for the tracking circuit in FIG. 1 in accordance with some embodiments.

FIG. 6 is a plot showing waveforms of TWL and TBL with different control signals for the tracking circuit in FIG. 1 in accordance with some embodiments. As the tracking cell power voltage TCP is increased, the tracking bit line TBL response time becomes faster in some embodiments. A tracking word line TWL waveform 600 is enabled (logic 1/logic high) at time t0. As the stored data in the tracking cell 104 (logic 0/logic low) is transferred to the tracking bit line TBL, the tracking bit line TBL waveforms 602, 604, 606, and 608 are changed from logic 1/logic high to logic 0/logic low at different times t1, t2, t3, and t4 respectively, depending on the tracking cell power voltage TCP.

In some embodiments, an access timing of the memory is controlled based on the tracking bit line TBL response. For example, a time delay can be added from the tracking bit line TBL response time before a sense amplifier enable (SAE) is asserted in some embodiments. The time delay is added to avoid errors from insufficient read time and can be different for various applications. Also, the word line of the memory can be disabled based on the tracking bit line TBL response time in some embodiments. The SAE timing and/or the word line disable time is delayed to allow sufficient reading time in some embodiments.

Assuming the exemplary control signal scheme in FIG. 5 is used, the tracking bit line TBL waveform 602 corresponding to the control signal <11> has the fastest response time at t1. As the tracking cell power voltage TCP is decreased, the corresponding tracking bit line TBL waveforms 604, 606, and 608 have slower response times at t2, t3, and t4, respectively. Therefore, by adjusting the control signal, the effective delay of the tracking bit line TBL can be controlled by changing the tracking cell power voltage TCP. An exemplary voltage generator 102 is described below with respect to FIG. 7.

Figure 7:
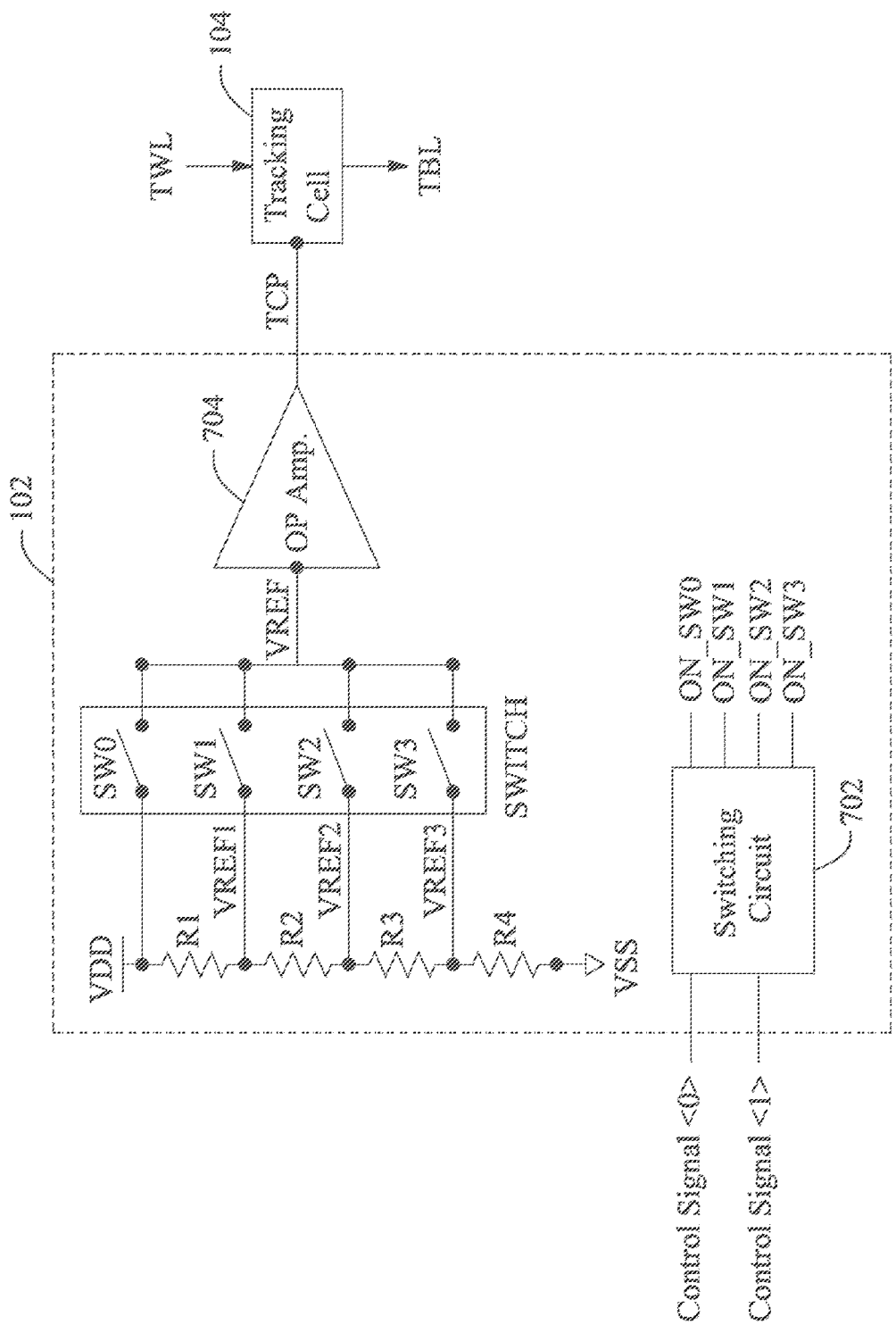
FIG. 7 is a schematic diagram of an exemplary voltage generator for the exemplary tracking circuit of FIG. 1 with in accordance with some embodiments.

FIG. 7 is a schematic diagram of an exemplary voltage generator 102 for the tracking circuit in FIG. 1 accordance with some embodiments. The voltage generator 102 includes a switching circuit 702, resistors R1, R2, R3, and R4, switches SW0, SW1, SW2, and SW3, and an operational amplifier 704 in some embodiments. In this example, a 2-bit control signal including control signal <0> and control signal <1> are received by the switching circuit 702 in the voltage generator 102.

The switching circuit 702 provides switch enable signals ON_SW0, ON_SW1, ON_SW2, and ON_SW3 based on the received control signal. For example, if the received control signal is <11>, the switch enable signal ON_SW0 can be asserted to enable the switch SW0. If the received control signal is <10>, the switch enable signal ON_SW1 can be asserted to enable the switch SW1. If the received control signal is <01>, the switch enable signal ON_SW2 can be asserted to enable the switch SW2. If the received control signal is <00>, the switch enable signal ON_SW3 can be asserted to enable the switch SW3.

Based on which switch is enabled (connected), an input voltage VREF to the operational amplifier 704 is determined from the serially connected resistors R1, R2, R3, and R4. The resistors R1, R2, R3, and R4 are coupled to the high power supply voltage VDD of the memory and the low power supply voltage VSS (or ground). The resistance values of the resistors R1, R2, R3, and R4 are selected to be relatively high to limit the current from VDD to VSS through the resistors R1, R2, R3, and R4.

The tracking cell power voltage TCP is provided by the operational amplifier 704 based on the input voltage VREF to the operational amplifier 704. The input voltage VREF of the operational amplifier 704 depends on which switch is enabled (connected). The voltage generator 102 in FIG. 7 is intended as an example, and any other suitable voltage generator that can be controlled with the control signal can be used to provide the tracking cell power voltage TCP.

Figure 8:
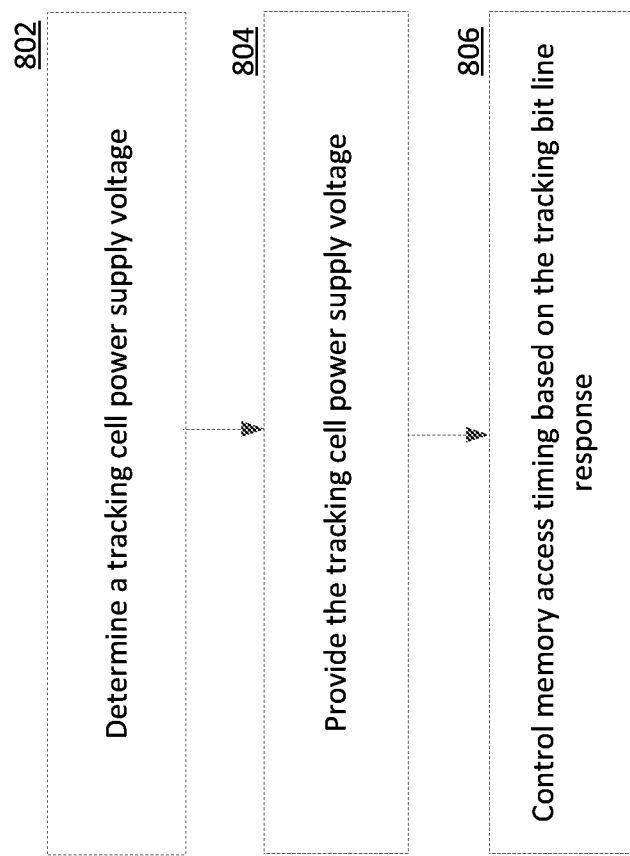
FIG. 8 is a flowchart for the exemplary tracking circuit in FIG. 1 in accordance with some embodiments.

FIG. 8 is a flowchart for the exemplary tracking circuit in FIG. 1 in accordance with some embodiments. At operation 802, the tracking cell power voltage TCP is determined. In some embodiments, the initial tracking cell power voltage TCP can be determined based on simulation, data from a similar memory, measurement on a similar memory, estimation from previous design, or any other suitable method. Also, the value of the tracking cell power voltage TCP can be changed and updated during testing and/or operation of the memory including the tracking cell 104.

At operation 804, the tracking cell power supply voltage TCP is provided by the voltage generator 102 to the tracking cell 104. In some embodiments, a control signal received by the voltage generator 102 controls the tracking cell power supply voltage TCP. In some embodiments, the control signal is generated by the control circuit 108 for the corresponding tracking cell power voltage TCP.

At operation 806, memory access timing is controlled based on the tracking bit line response. For example, a time delay can be added from the response time of the tracking bit line TBL before a sense amplifier enable (SAE) is asserted in some embodiments. Also, the word line (WL) of the memory can be disabled based on the tracking bit line response time in some embodiments.

The tracking word line TWL delay emulates the delay due to the length of a real memory array in the word line direction. The tracking bit line TBL delay emulates the delay due to the length of the real memory array in the bit line direction.

From the response time of the tracking bit line TBL, appropriate SAE and WL pulse disable timing can be determine. For a slow TBL response time, the timing of SAE and WL_disable are adjusted to be slow, and for a fast TBL response time, the timing of SAE and WL_disable are adjusted to be fast.

According to the tracking scheme described above, the tracking cell performance such as response speed can be controlled by a variable tracking cell power voltage TCP. The tracking cell power voltage TCP is generated by a voltage generator 102 based on a control signal. The control signal is provided by a control circuit connected to the tracking bit line TBL. By using a variable tracking cell power voltage TCP, the tracking cell cover range can be changed from the different response speed depending on the tracking cell power voltage TCP.

In some embodiments, the control signal range can be varied corresponding to the desired tracking cell speed (delay) range from estimated or measured PVT variations of memory cells. For example, from estimated or measured PVT variations of memory cells, the control signal range can be determined to change the tracking cell power voltage TCP to cover a 3-sigma or 6-sigma variation range of corresponding tracking cell speed (delay). In some embodiments, a 6-sigma range is used to cover a relatively slow speed memory device, and a 3-sigma range is used to cover a relatively fast speed memory device.

According to some embodiments, a tracking circuit for a memory includes a tracking cell. A tracking word line is connected to the tracking cell. A tracking bit line is connected to the tracking cell. A voltage generator is configured to provide a variable tracking cell power supply voltage to the tracking cell based on a control signal.

According to some embodiments, a method includes determining a tracking cell power supply voltage for a tracking cell in a memory. The tracking cell power supply voltage is provided to the tracking cell. A memory access timing is controlled based on a response time of a tracking bit line, wherein the tracking bit line is connected to the tracking cell.

According to some embodiments a tracking circuit for a memory, includes a tracking cell. A tracking word line is connected to the tracking cell and a first plurality of loading memory cells. A tracking bit line is connected to the tracking cell and a second plurality of loading memory cells. A control circuit is connected to the tracking bit line. The control circuit generates a control signal. A voltage generator is configured to provide a variable tracking cell power supply voltage to the tracking cell based on the control signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A tracking circuit for a memory, comprising:
   a tracking cell;
   a tracking word line connected to the tracking cell;
   a tracking bit line connected to the tracking cell; and
   a voltage generator connected to a tracking cell power supply node and configured to provide a variable tracking cell power supply voltage to the tracking cell based on a control signal, wherein the variable tracking cell power supply voltage comprises a plurality of selectable operational voltages.

2. The tracking circuit of claim 1, further comprising a control circuit connected to the tracking bit line, wherein the control circuit generates the control signal.

3. The tracking circuit of claim 2, wherein the control signal is generated based on a response time of the tracking bit line.

4. The tracking circuit of claim 2, wherein the control signal controls an access timing of the memory.

5. The tracking circuit of claim 1, wherein the tracking word line is connected to a first plurality of loading memory cells.

6. The tracking circuit of claim 5, wherein the tracking bit line is connected to a second plurality of loading memory cells.

7. The tracking circuit of claim 1, wherein the variable tracking cell power supply voltage is an operational voltage equal to or less than a high power supply voltage provided to the memory.

8. The tracking circuit of claim 1, wherein the tracking cell comprises a PMOS transistor, and a substrate of the PMOS transistor is coupled to the variable tracking cell power supply voltage.

9. The tracking circuit of claim 1, wherein the tracking cell comprises a PMOS transistor, and a substrate of the PMOS transistor is coupled to a high power supply voltage provided to the memory.

10. A method, comprising:
    determining a tracking cell power supply voltage for a tracking cell in a memory;

generating, using a voltage generator, a variable tracking cell power supply voltage, the variable tracking cell power supply voltage selected from a plurality of operational voltages;

providing the variable tracking cell power supply voltage to the tracking cell via a tracking cell power supply node; and controlling, using a control circuit, a memory access timing based on a response time of a tracking bit line, wherein the tracking bit line is connected to the tracking cell.

11. The method of claim 10, further comprising the voltage generator generating the variable tracking cell power supply voltage based on a control signal.

12. The method of claim 11, further comprising generating the control signal, wherein the control circuit is connected to the tracking bit line.

13. The method of claim 10, further comprising using a first plurality of loading memory cells to provide a loading emulation for a tracking word line connected to the first plurality of loading memory cells and the tracking cell.

14. The method of claim 13, further comprising using a second plurality of loading memory cells to provide a loading emulation for a tracking bit line connected to the second plurality of loading memory cells.

15. The method of claim 10, wherein the tracking cell power supply voltage is an operational voltage equal to or less than a high power supply voltage provided to the memory.

16. The method of claim 10, further comprising coupling a substrate of a PMOS transistor in the tracking cell to the tracking cell power supply voltage.

17. The method of claim 10, further comprising coupling a substrate of a PMOS transistor in the tracking cell to a high power supply voltage provided to the memory.

18. A tracking circuit for a memory, comprising:
a tracking cell;
a tracking word line, wherein the tracking word line is connected to the tracking cell and a first plurality of loading memory cells;
a tracking bit line, wherein the tracking bit line is connected to the tracking cell and a second plurality of loading memory cells;
a control circuit connected to the tracking bit line, wherein the control circuit generates a control signal; and
a voltage generator configured to provide a variable tracking cell power supply voltage to the tracking cell, via a variable tracking cell power supply node, based on the control signal, the variable tracking cell power supply voltage comprising one of a plurality of selectable operational voltages.

19. The tracking circuit of claim 18, wherein the control signal is generated based on a response time of the tracking bit line.

20. The tracking circuit of claim 18, wherein the control signal controls an access timing of the memory.

* * * * *